(12) United States Patent
Haag

(10) Patent No.: US 6,740,856 B1
(45) Date of Patent: May 25, 2004

(54) PREFORMED HEATING ELEMENT AND METHOD OF MAKING

(75) Inventor: Rondald H. Haag, Clarkston, MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/360,589

(22) Filed: Feb. 6, 2003

(30) Foreign Application Priority Data

Oct. 31, 2000 (JP) ........................................ 2000-333368

(51) Int. Cl.$^7$ ................................................ H05B 3/16
(52) U.S. Cl. ........................ 219/543; 219/204; 219/528; 219/535; 219/549
(58) Field of Search ................................ 219/543, 544, 219/546, 547, 548, 549

(56) References Cited

U.S. PATENT DOCUMENTS

| | | |
|---|---|---|
| 2,835,777 A | 5/1958 | Gates et al. |
| 3,349,722 A | 10/1967 | Davis |
| 3,851,150 A | 11/1974 | Von Holzen |
| 4,547,655 A | 10/1985 | Kurata et al. |
| 4,631,976 A | 12/1986 | Noda et al. |
| 4,707,396 A | 11/1987 | Wank et al. |
| 5,408,069 A * | 4/1995 | Mischel, Jr. ............ 219/219 |
| 6,093,908 A | 7/2000 | Haag |
| 6,093,910 A | 7/2000 | McClintock et al. |
| 6,172,342 B1 | 1/2001 | Khafagy et al. |
| 6,194,692 B1 * | 2/2001 | Oberle ................... 219/543 |
| 6,392,195 B1 | 5/2002 | Zhao et al. |
| 6,441,344 B1 | 8/2002 | Bonn et al. |
| 6,512,202 B2 | 1/2003 | Haag et al. |
| 2001/0003336 A1 | 6/2001 | Abbott et al. |
| 2002/0008097 A1 | 1/2002 | Hobby |
| 2002/0096512 A1 | 7/2002 | Abbott et al. |

FOREIGN PATENT DOCUMENTS

DE 297 12 839 U1 10/1997

OTHER PUBLICATIONS

Document entitled: "Product Applications Makrofol® Polycarbonate and Bayfol® Polycarbonate Blend Films", 3 pp.
Makrofol® Bayfol® Application Technology Information document entitled "In–Mould Decoration", dated Sep. 1999, 8 pp.
Makrofol® Bayfol® Application Technology Information document entitled "New applications and practical examples involving in–mould decoration", dated Sep. 30, 1997, 20 pp.
Co–pending application entitled "Apparatus and Method for a Preformed Heating Element for a Steering Wheel", attorney docket number DP–308668 filed contemporaneously.

* cited by examiner

Primary Examiner—Edward K. Look
Assistant Examiner—Vinod D. Patel
(74) Attorney, Agent, or Firm—Scott A. McBain

(57) ABSTRACT

In one embodiment of the present disclosure a preformed heating member is disclosed, the preformed heating element comprising: a first layer having a conductive layer for receiving an electrical current and providing a source of heat, the conductive layer being disposed on a sheet of formable film; and an outer layer disposed over the conductive layer; and a second structural layer adhered to the first layer, wherein the preformed heating element is capable of being configure to be positioned over a corresponding location.

16 Claims, 5 Drawing Sheets

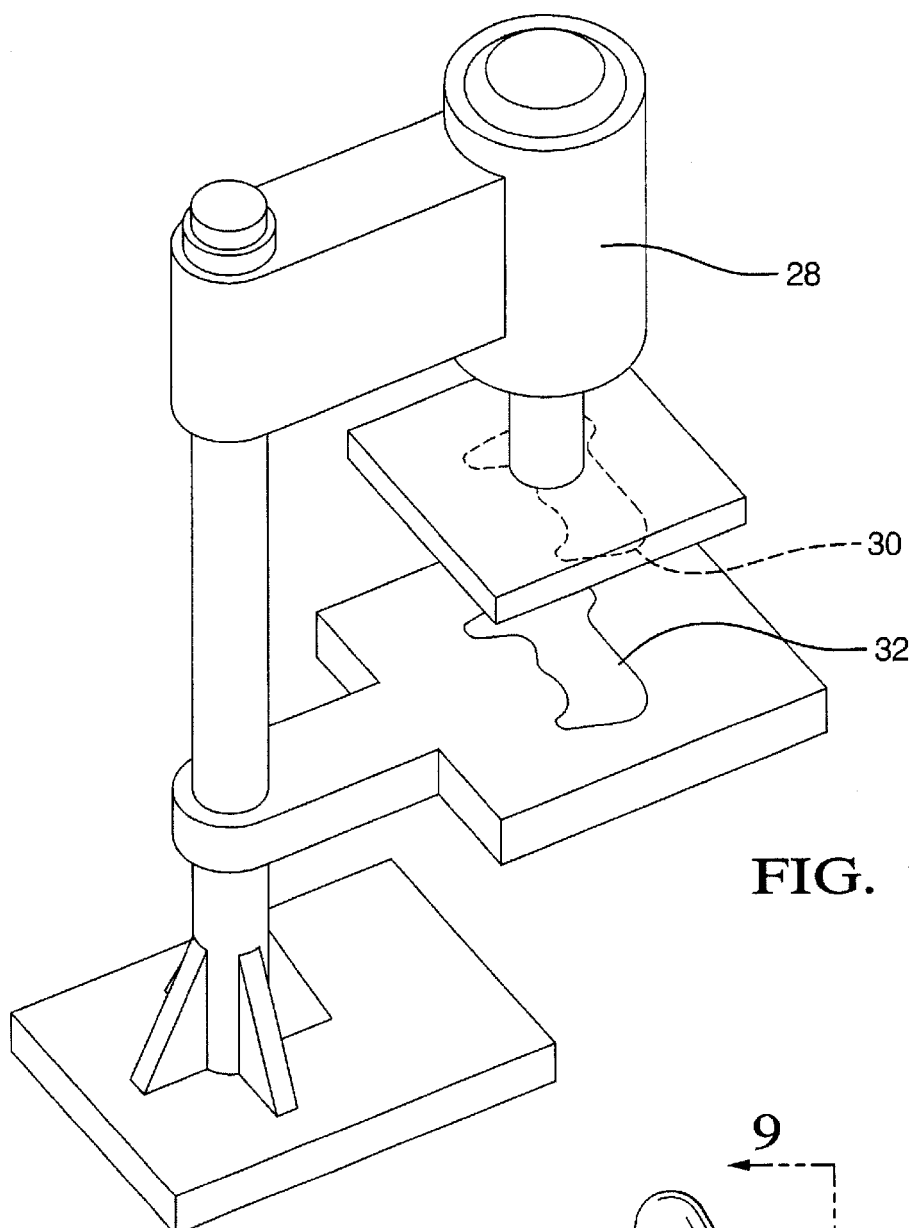
FIG. 7
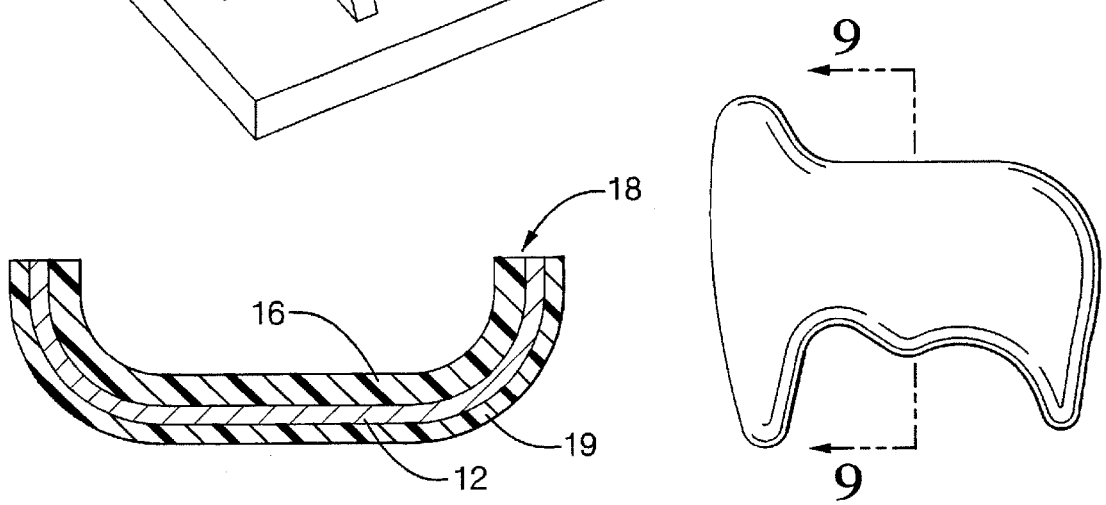
FIG. 9
FIG. 8

PREFORMED HEATING ELEMENT AND METHOD OF MAKING

CROSS REFERENCE TO RELATED APPLICATION

The present application is related to commonly owned and assigned U.S. patent application, entitled: "Apparatus and Method for a Preformed Heating Element for a Steering Wheel", Ser. No. 10/360,574, filed contemporaneously with this application the contents of which are incorporated herein by reference thereto.

TECHNICAL FIELD

The present disclosure relates to a preformed heating element and a process for its manufacture.

BACKGROUND

Various heating elements have been devised to provide a source of heat to remote locations. For example, attempts have been made to provide a steering wheel with a heater element to alleviate the uncomfortable touching of the steering wheel by a driver during cold weather. Other applications have included attempts to provide heat to mechanical parts, which operate more efficiently when preheated and are exposed to colder elements for an extended period of time. An example of this type of application would be component parts of an internal combustion engine wherein prolonged exposure to cold temperature may affect the initial or start up performance of the engine.

Most of these prior attempts have followed the traditional approach of using length of resistance wire as the heating element. In order to provide a source of heat an electrical current is then arranged to pass through the resistance wire. The wire is located at the desired location, which sometimes is remote and not easily accessible while also being subjected to excessive wear and tear. This excessive wear and tear may ultimately damage the wire and/or heating element.

However, such prior art arrangements have not been very successful due to various factors. Some of these prior art arrangements are complex and require major structural modifications of intended heating area, which unduly adds to the cost of manufacture of the heated part. A further difficulty includes the method of assembling such heating elements due to the complex three-dimensional shapes, and the poor elongation characteristics of the heating element.

In addition, sometimes these complex three-dimensional shapes may include features, abrasions or protrusions, which may affect the design and performance of the heating element.

SUMMARY

Therefore, it is an object of the present disclosure to create a preformed heating element that provides for a simple method of its assembly at a desired location, and a preformed heating element that protects an internal heating element.

In one embodiment of the present disclosure a preformed heating member is disclosed, the preformed heating element comprising: a first layer having a conductive layer for receiving an electrical current and providing a source of heat, the conductive layer being disposed on a sheet of formable film; and an outer layer disposed over the conductive layer; and a second structural layer adhered to the first layer, wherein the preformed heating element is capable of being configure to be positioned over a corresponding location.

In exemplary embodiment the preformed heating element is formed with the following manufacturing methods: inking; vacuum forming; and resin impregnating or injection molding.

The above-described and other features and advantages of the present invention will be appreciated and understood by those skilled in the art from the following detailed description, drawings, and appended claims.

BRIEF DESCRIPTION OF THE DRAWINGS

FIG. 7 is a perspective view of a machine used to stamp the formed part from the sheet illustrated in FIGS. 1 and 2;

FIG. 8 is a top plan view of a formed part from the sheet illustrated in FIGS. 1 and 2;

FIG. 9 is a view along lines 9—9 of FIG. 8;

DETAILED DESCRIPTION

In accordance with an exemplary embodiment of the present disclosure the preformed heating element comprises a first layer having a formable film, a conductive layer disposed on the formable film and being adapted to be electrically connected to a source of power, an encapsulating or outer layer disposed on the conductive layer, which may provide aesthetic qualities as well as encapsulating qualities and a second layer adhered to the first layer, the second layer providing structural characteristics to the preformed heating element.

The first layer is formed by a forming process such as vacuum forming wherein the formable film, the conductive layer and the encapsulation or outer layer are heated and vacuum formed to have a unique configuration corresponding to the vacuum forming mold. The unique configuration of the mold will provide a first layer and ultimately a preformed heating element that mates or corresponds to a unique configuration of an area to be heated, which in an exemplary embodiment is achieved by applying a current to the conductive layer of the preformed heating element.

After the first layer is formed, the portion of the first layer corresponding to the preformed heating element is then adhered to a second layer, which in an exemplary embodiment, is applied by an injection molding process. The second layer is adhered to the formable film layer at an opposite side of the conductive layer. The second layer is typically thicker than the first layer and provides structural rigidity to the first layer, as the first layer comprises formable materials and in an exemplary embodiment the outer layer is relatively thin thereby allowing the heat generated by the conductive layer to radiate outwardly in a preferred manner.

Figure 1:
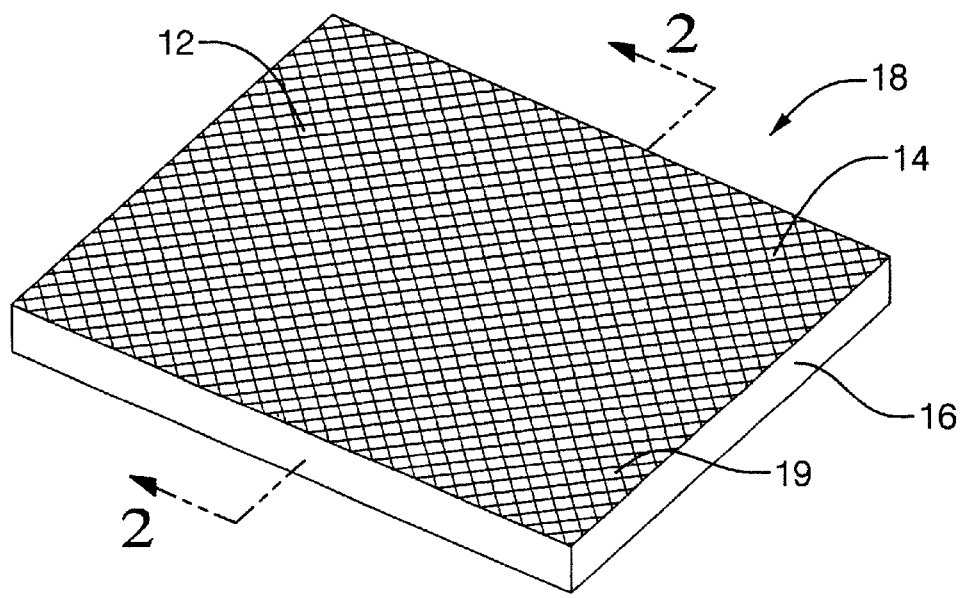
FIG. 1 is a perspective view of a sheet used to form a portion of the preformed heating element.
Figure 2:
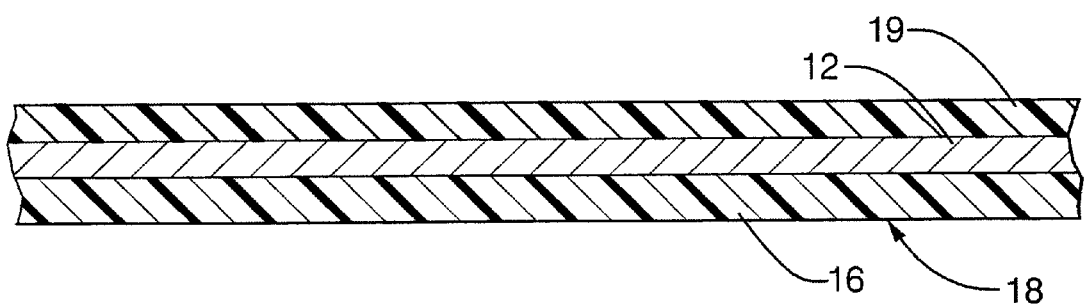
FIG. 2 is a view along lines 2—2 of FIG. 1.
Figure 3:
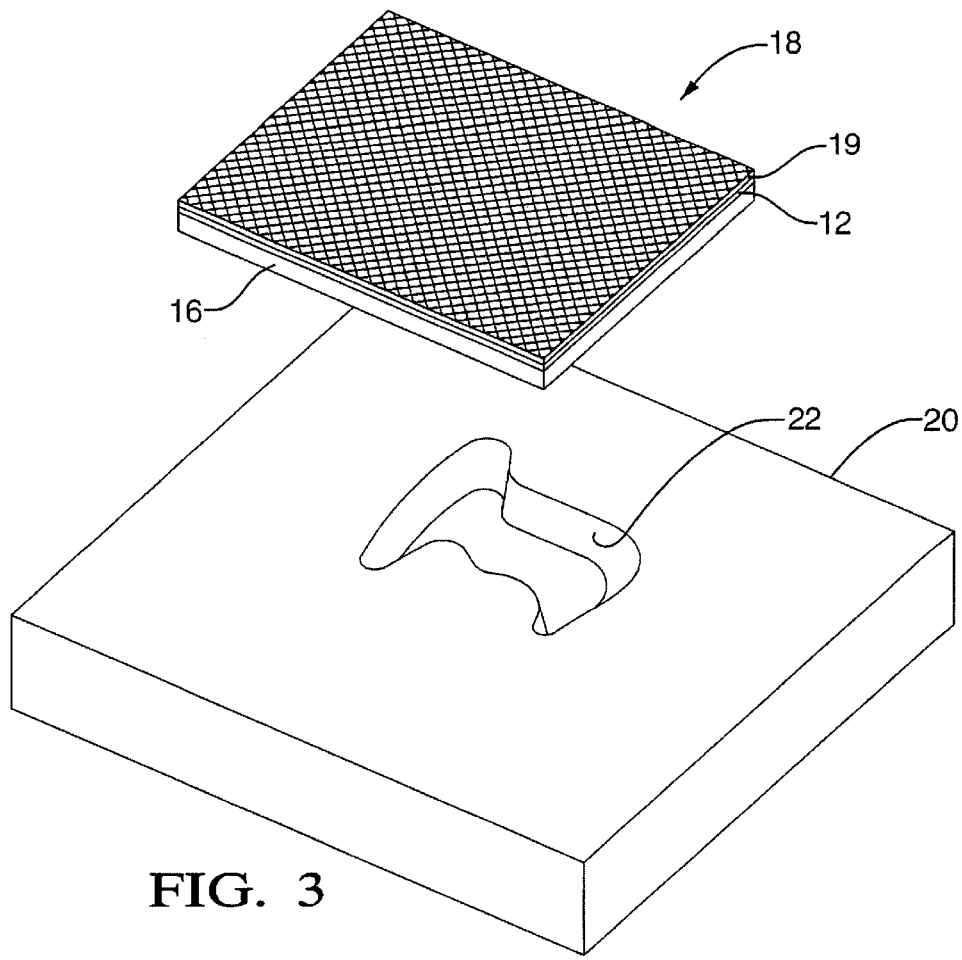
FIG. 3 is a perspective view of mold used to form the sheet illustrated in FIGS. 1 and 2.
Figure 4:
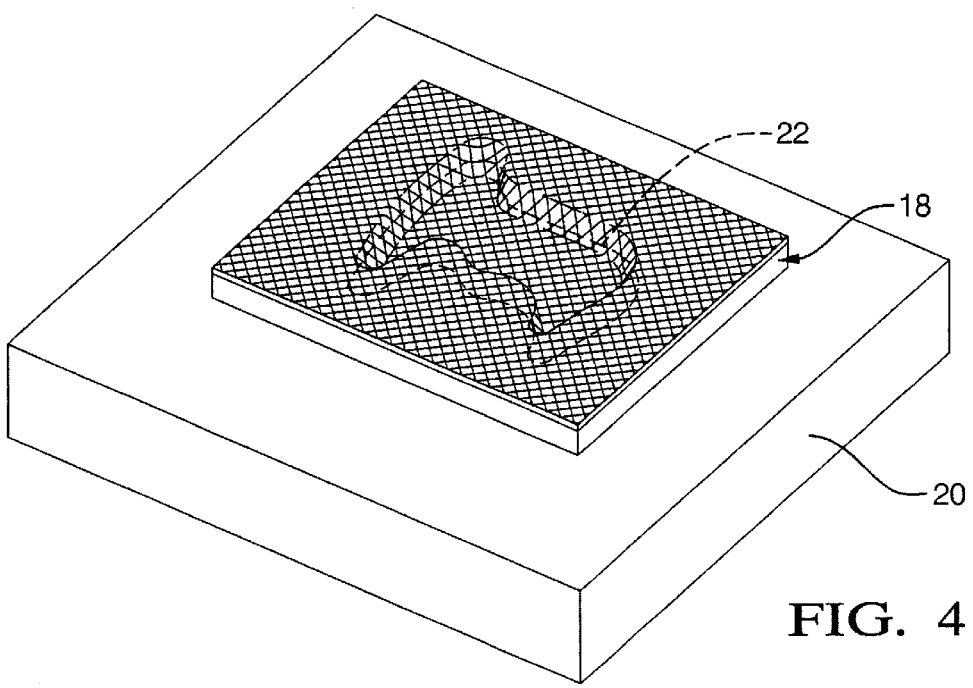
FIG. 4 is a perspective view of the forming process used to form the sheet illustrated in FIGS. 1 and 2.
Figure 5:
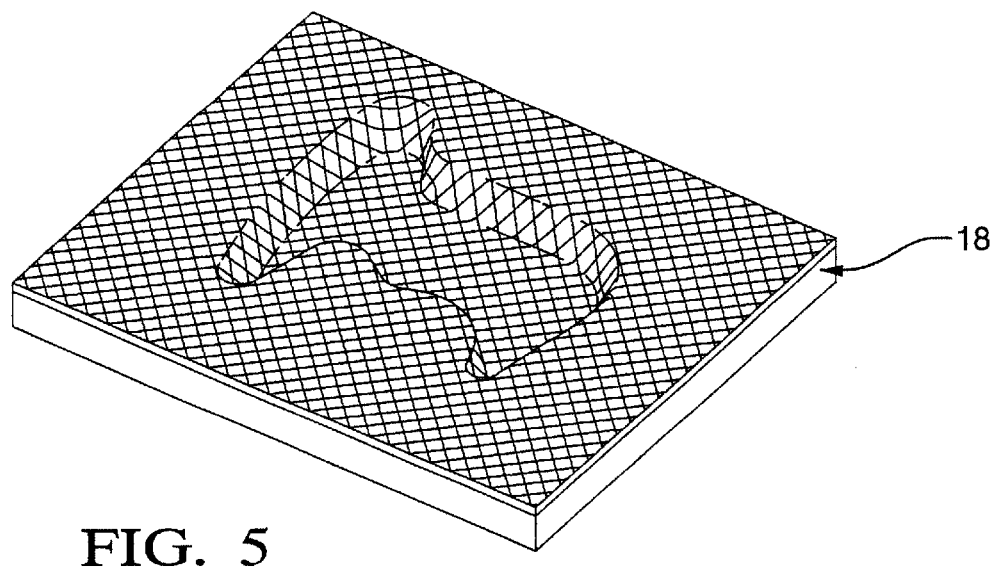
FIG. 5 is a perspective view of a sheet formed by the die of FIG. 3.
Figure 6:
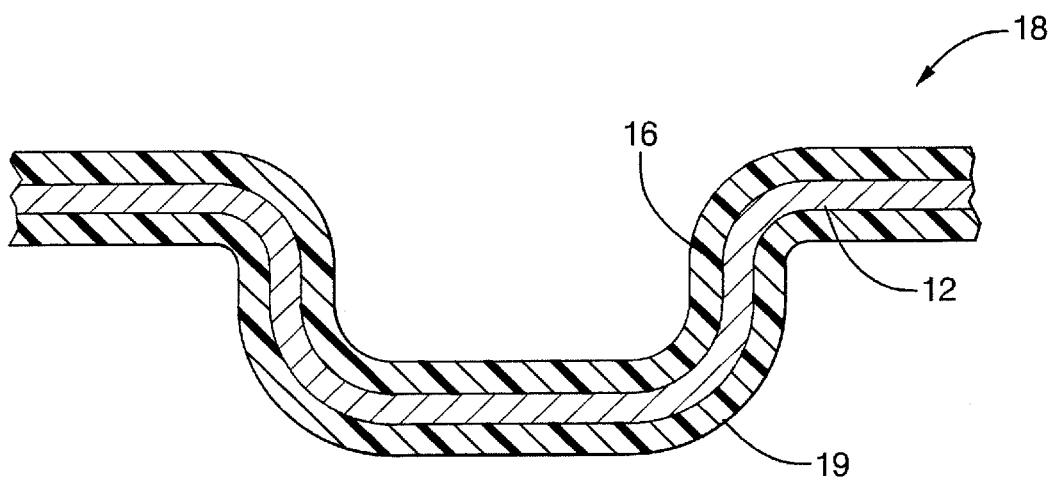
FIGS. 6A–6B are cross-sectional views of a sheet formed by the die of FIG. 3.
Figure 6:
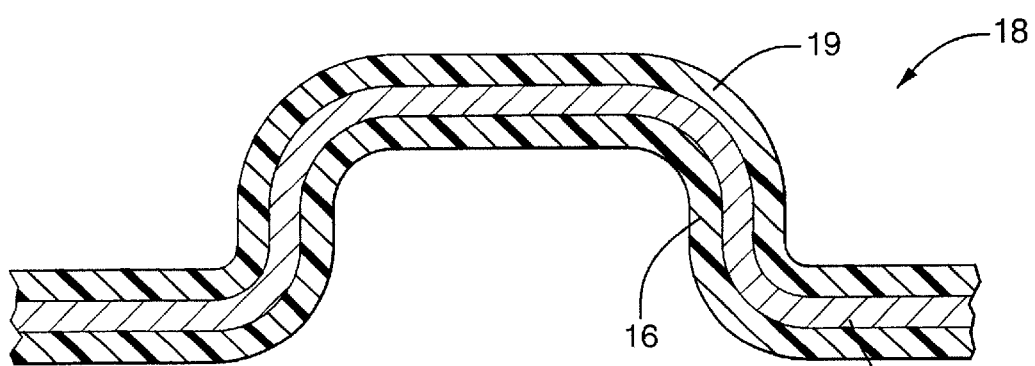
Figure 10:
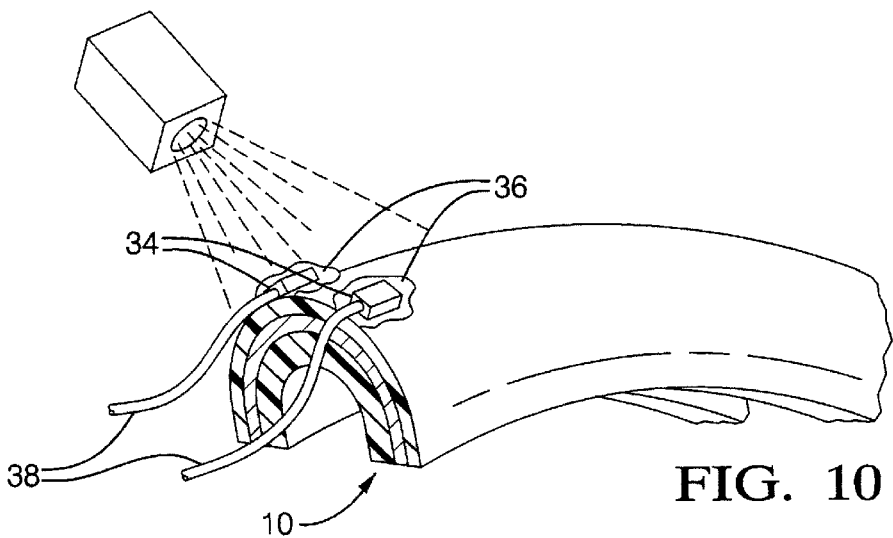
FIG. 10 is a perspective view of an application of terminals to the part formed from the sheet illustrated in FIGS. 1 and 2.

Referring now to FIGS. 1–12, a preformed heating element 10 and a process for manufacturing the preformed heating element in accordance with an exemplary embodiment of the present disclosure is and described. The heating element comprises an electrically conductive layer 12 deposited directly on a first surface 14 of a portion of a material 16. Referring now to FIGS. 1 and 2 and in accordance with the present disclosure, material 16 is a sheet of specially designed formable film, which comprises the first surface and a portion of the first layer of the heating element.

In accordance with an exemplary embodiment the sheet of formable film is a Bayer Makrofol Polycarbonate or a Bayfol Polycarbonate blended film or equivalent thereof. Examples of such material and their properties are identified in the document entitled"Product Applications MAKROFOL Polycarbonate and BAYFOL Polycarbonate blend films" and identified in the Information Disclosure Citation filed with the present application, the contents of which are incorporated herein by reference thereto.

The electrically conductive layer is deposited on material 16 prior to its formation by the methods disclosed herein. In a preferred application process the electrically conductive layer is applied using a screening process wherein the conductive layer is screened onto the material 16 before or during the forming process of the first layer. The electrically conductive layer comprises an electrically conductive material, which may include metal, electrically conductive carbon including carbon and/or graphite particles, fibrils, fibers, micro-tubes, and a combination comprising at least one of the aforementioned materials. The preferred electrically conductive material for use herein is also thermally conductive. Other preferred materials for the electrically conductive layer comprise copper, silver, nickel, and alloys of any one of the foregoing materials.

In one embodiment, the electrically conductive layer is formed from a curable electrically conductive ink 12 comprising an electrically conductive material wherein the ink is deposited directly on the first surface of material 16.

The term"curable, cured, and curing" as used herein with regard to the electrically conductive ink, refers to any appropriate drying, reacting, crosslinking, solidification, evaporation of solvent, and the like required to convert the electrically conductive ink into a dry, preferably non-tacky state. These include air-drying, heat curing, curing through irradiation including, for example through exposure to UV light, and the like.

The formable film is screened with the specially formulated conducting inks 12 which comprise the electrically conductive layer. In one embodiment the electrically conductive material is dispersed in an ink as a finely divided particle, powder, and/or flake. Alternatively, the electrically conductive material is dispersed within the ink to form an essentially uniform mixture, admixture and/or composition that is readily sprayed to form an essentially uniform layer on a substrate. The ink may also include a solvent, a drying retarding agent, a surfactant, a viscosity modifying agent, or a combination comprising at least one of the foregoing. Suitable solvents for use herein include both water and organic solvents. For example, a curable conductive ink comprising a silver and copper mixture such as Electrodag SP-405 type (commercially from Acheson Colloids Company, Port Huron, Mich., U.S.A.), or equivalents thereof are contemplated for use as the curable conductive ink. The conducting ink is applied across the entire surface of the formable film in order to create heating a heating element surface area, which will comprise the electrically conductive layer of the preformed heating element. As illustrated in FIG. 1, the configuration of the heating element surface area is an interlocking grid. Of course, the heating element surface area can have other configurations or may completely cover an entire surface of the formable film.

The initial value of resistance of the heating element will be considerably lower in the two-dimensional shape (prior to forming) than when it will be in its final three-dimensional shape (after forming). Therefore, it will be necessary to determine the resistance values and appropriate changes (e.g., from two to three dimensions) in order to determine the required resistance for each desired application, which depends ultimately on the final configuration of the preformed heating element. The resistance of the conductive layer is tested in accordance with known technologies such as applying a known current value and measuring the voltage drop across the area of the conductive ink being tested.

Thus, and in order to provide the appropriate amount of heat energy, the surface resistivity of the electrically conductive layer must be determined. Suitable levels of surface resistivity depend on the total surface area required, the amount of heat required, and the voltage applied to produce the heat. Also important in determining the surface resistivity is the thickness of the conductive layer. A non-uniform heat load may be applied to these, or other discrete positions of the preformed heating element such that varying the thickness of the conductive layer to form localized higher heating zones varies the resistivity local to those positions. These higher heating zones result from the increased power dissipated from the thinner areas as compared to the thicker areas, both of which are simultaneously provided with the same amount of current.

The method by which the conductive layer is applied to the surface of the steering wheel needs to be suitable to form a continuously conductive layer over the desired portion of the preformed heating member. Suitable methods of deposition include dipping, spray coating, gas assisted spray coating, electrospray coating, powder coating, screen printing, ink jet printing, electrostatic printing, or the application of a preprinted sheet of a conductive material and equivalents thereof.

Printing, spraying and other techniques capable of providing the layer of conductive material where needed, without masking, and with a minimal amount of over spray are contemplated for applying the conductive layer. Examples of suitable printing processes include gas (e.g., air) assisted spraying which directs the sprayed material onto the surface with minimal if any amount of waste.

The conductive layer may be a single layer of conductive material, or in the alternative may include a plurality of layers, at least one of which is electrically conductive. This plurality of layers may also include protection layers applied to provide resistance to wear and abrasion, protection from liquids, or a combination comprising the conductive layer applied to the formable film.

In accordance with an exemplary embodiment the ink is cured by running it through an oven at specified times and temperatures, which will depend on the thickness of the ink and the drying time specifications of the ink used. In addition, the film and the ink screened onto it may also affect the drying time and heat. Finally, the size of the part may also be a contributing factor to the amount of time (e.g., deformations in the formed part may lengthen or shorten the drying time and/or temperature).

After the conductive layer 12 is applied and cured another layer 19 is applied on top of conductive layer 12. In an exemplary embodiment layer 19 comprises a layer of decorative film or indicia which is applied on top of the conductive layer, the decorative layer 19 will correspond to the preferred usage and location of the pre-formed heating element having a unique configuration (e.g., an interior trim portion of a vehicle) or alternatively, an item for heating a mechanical component such as a vehicle engine wherein the indicia of layer 19 provides information to an individual such as an engineer or mechanic. Layer 19 in addition to providing indicia or a decorative appearance also encapsulates conductive layer 12 protecting it from damage. The thickness of layer 19 is sufficient enough to protect conductive layer 12, while allowing the heat generated by conductive layer 12 to radiate outwardly through layer 19.

In an exemplary embodiment formable sheet 16, conductive layer 12 and layer 19 form first layer 18 and are all capable of being formed by a forming process in order to achieve the desired configuration of first layer 18 and ultimately the preformed heating element.

Referring now to FIGS. 3–12 and in accordance with an exemplary embodiment, sheet 16 having layer 12 and layer 19 deposited thereon is shaped by thermoforming (vacuum) or by a high-pressure forming process wherein the sheet with the conductive layer and layer 19 applied thereon is positioned over a forming tool 20 or die that has a cavity 22 corresponding to the desired shape of the first layer and at least a portion of the preformed heating element.

Alternatively, forming tool 20 may comprise a specific profile or protrusion wherein the sheet is vacuum formed around the protrusion of the tool. In yet another alternative, the tool may have both the protrusions and cavities to shape the sheet with the forming process.

As is known in the art, and if a vacuum forming process is used the sheet is subjected to heat and a vacuum or suction force is applied to mold the heated item around the configuration of the mold. Thus, when the vacuum forming or high pressure forming process is complete a portion of the sheet is formed to have the configuration of cavity 22 or the specific configuration of the tool. In accordance with an exemplary embodiment the forming tool is designed to create a part that will have an encapsulated heating element, which is sandwiched between layer 19 and formable film 16. The cycle times, temperatures, and vacuum or pressures are set up accordingly to create the proper characteristics of the element design itself. In accordance with an exemplary embodiment, the sheet is formed with a vacuum forming or high pressure forming process in accordance with known technologies.

The part or cavity is capable of defining a feature on first layer 18 to accommodate a protuberance on the item onto which the preformed heating element is to be located. Thus, sheet 16 with conductive layer 12 and layer 19 is capable of being formed into any shape, which is capable of being defined by the cavity of the die.

Once the forming process is complete the sheet is now formed with a part corresponding to the cavity of the forming tool. Is it noted that the layer of conductive ink can be positioned either facing into the cavity or out of the cavity. For example, FIGS. 6A and 6B illustrate cross sectional views of a part formed by the mold of FIG. 5 wherein the side of the formable film with the conductive layer and layer 19 deposited thereon is inserted into the cavity first (FIG. 6A) or last (FIG. 6B). Accordingly, the formed first layer is capable of being formed with the conductive layer closer to either portion of the first layer formed by the manipulation of the formable sheet, conductive layer 12 and layer 19.

It is noted that the dimensions, configurations and proportional relationships illustrated in the Figures of the present application are provided as examples and are not intended to be limiting. Therefore, it is contemplated that the dimensions, configurations and proportional relationships of the present disclosure may vary from those illustrated in the Figures.

Referring now to FIGS. 7–12 and once the aforementioned forming step is complete the pre-formed part is cut and trimmed from the sheet by a cutting/trimming process wherein the preformed film part of the desired configuration is cut by a column guided punching tool 28 having a male 30 and female 32 die set corresponding to the formed part (cavity 22) allows for the part to be stamped or cut from the sheet. Thus, the part (FIGS. 8 and 9) is cut from the sheet. In addition, and if required the formed part can be trimmed or polished to remove any burrs or irregularities in the part.

It is noted that due to the formable characteristic of sheet 16 and the ability to apply the conductive ink and layer 19 thereon the formed part (cavity and/or mold 22) can take on any shape. Thus, the part illustrated in the figures of the present disclosure is for illustration purposes only and it is contemplated that the formed part may comprise any configuration, which is defined by cavity 22.

Once the cutting/trimming process is complete a pair of terminals 34 for supplying an electrical current to the heating element are inserted into the heating element of the formed part. In one embodiment, the terminals are fastened/connected to the heating element with a conductive epoxy 36. Ultraviolet light or other equivalent method is used to cure the epoxy. The number and location of terminals may vary in order to limit the number of electrical connections for the assembled unit. Of particular note is that the terminals must make contact with the conductive layer. Therefore, if the terminals are applied after first layer 18 is formed (FIGS. 1–9) a portion of either layer 19 or formable sheet 16 must be removed to allow the terminals to contact the conductive layer. Alternatively, a post may be drilled into either sheet 16 or layer 19 to make contact with the conductive layer. In yet another alternative, the terminals may be applied before, during or immediately after the application of the conductive layer on formable sheet 16 thereby negating the need to remove a portion of layer 19 or sheet 16. Each of the terminals has a conductor 38, which is secured, to a source of electrical power (e.g., a bus bars or equivalent thereof) disposed about the desired location of preformed heating element).

Of course, other means for attaching the terminals are contemplated for use in accordance with the present disclosure. For example, and in one embodiment the terminals are riveted to the element. This is particularly advantageous when the element has a flat shape or the point of connection for the terminal is located at a flat portion of the preformed element. Of course, the area where the riveting occurs does not have to include a flat shape.

Another method of securing the terminals would be a stapling method, which again would be particularly advantageous when the element has a flat shape or the point of connection for the terminal is located at a flat portion of the preformed element. Of course, the area where the stapling occurs does not have to include a flat shape.

In either the stapling or riveting method of securement of the terminals there would be a tail portion extending away from the end of the formable element that remains flat and is not part of the formed shape. The tail portion need not be flat and/or may comprise part of the formed shape as long as there is a sufficient amount of material for electrical connection to the terminals. After the formed portion is injected molded the termination would be completed and then the tail portion would be tucked under the area under the rigid formed element, which would be out of the way and would not interfere with the securement of the preformed element is its desired location.

It is also noted that while the terminals are shown as being secured to a particular surface of the preformed element, they may of course, be secured to an opposite surface as long as they are electrically connected to the conductive layer. In addition, it is also preferable that the terminals also have a small profile (e.g. flat).

The formed part (first layer 18) with the terminals secured thereto is then inserted into an injection mold 40 to complete the preformed heating element by adhering a second layer to first layer 18. The injection mold comprises an upper mold half and a lower molding half each defining an appropriately configured cavity 42 that will define the final shape of the preformed heating element. An appropriate resin (polycarbonate, ABS, or polycarbonate ABS blends) 44 is injected from within the cavity through a conduit 46 in either mold half or alternatively is pre-applied into the cavity prior or after the insertion of the cut part (first layer 18) into the cavity. The resin 44 will comprise a second layer 48 that is adhered to the first layer by an injection molding process. When the resin is applied to the formable film directly this is sometimes referred to as back molding.

Accordingly, the resin and injection molding process is completed using known technologies. Thus, the conductive layer is now encapsulated between a layer of resin and the material of the formable sheet. This process adds a second layer 48 to the preformed heating element of the present disclosure.

Since each element of first layer 18 comprises a material that is formable and flexible by the vacuum forming process, first layer 18 is still flexible thus second layer 48 when cured is adhered to first layer 18 and increases the structural qualities of the preformed heating element.

Figure 11:
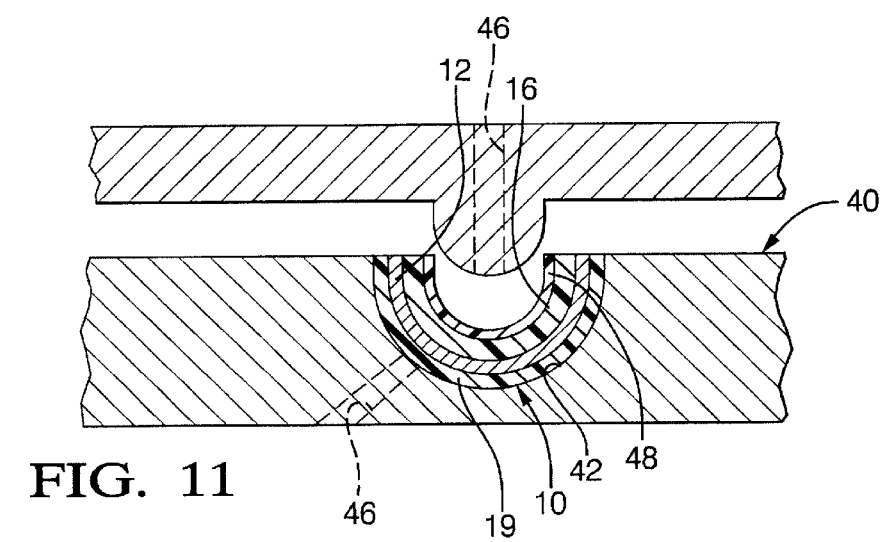
FIG. 11 is a cross-section view of an injection molding process wherein a second layer is added to the part formed from the sheet illustrated in FIGS. 1 and 2.

Although, FIG. 11 illustrates the resin being applied to the side of the formable film without the conductive layer, it should be appreciated that the resin may be applied to layer 19 or even replace layer 19.

Once the injection process is complete the part is then ejected from the mold. The resin of second layer 48 may also provides a means for holding the terminals in their place as well as providing a smooth outer layer and structural characteristics to the preformed heating element. Thus, the cavity of the injection molding process can provide either the exterior or the interior of the preformed heating element. For example, by positioning the first layer at the top or the bottom of the injection molding cavity allows the injection molding process to provide either the interior surface of the preformed heating element or the exterior of the preformed heating element.

Thus, first layer 18 comprising formable film 16, conductive layer 12 and layer 19 is injection molded with an appropriate resin providing a rigid preformed heating element which can be used in numerous applications.

The curable medium for the injection molding process may comprise a resin, preferably one selected from the group consisting of thermosetting resins, elastomeric resins, thermoplastic resins, and combinations comprising at least one of the foregoing. Suitable thermosetting resins for use herein include alkyds, diallyl phthalates, epoxies, melamines, phenolics, polyesters, urethanes, rigid silicones, and the like. Suitable elastomeric resins include acrylates, butyls, chlorosulfonated polyethylene, fluorocarbons, fluorosilicones, polysulfides, polyurethanes, neoprenes, nitrites, silicones, styrene, butadienes, and the like. Suitable thermoplastic resins include acetates, acrylics, cellulosics, chlorinated polyethers, fluorocarbons, nylons (polyamides), polycarbonates, polyethylenes, polypropylenes, polyimides, polyphenylene oxides, polystyrenes, polysulfones, vinyls, and the like. The preferred curable medium being acrylics.

As an alternative, a conductor or thermistor can be molded directly into the part to eliminate a secondary procedure in a plant where the preformed part is applied in its desired location. This conductor or thermistor may be encapsulated during the adhering of the second layer to the first layer in FIG. 11 or it may be added before, during and immediately after the depositing of the conductive layer on the formable sheet. The thermistor is contemplated for use with a controller such as the controller described and disclosed in U.S. Pat. No. 6,172,342 the contents of which are incorporated herein by reference thereto. Of course, other equivalent means for providing a current to the heating element are considered to be within the scope of the present disclosure.

Accordingly, once the preformed heating element is formed the exterior provides a smooth continuous surface as well as providing a means for accommodating irregularities encountered in the area of application of the pre-molded heating element in addition to simplifying the process for manufacturing a heated item.

Figure 12:
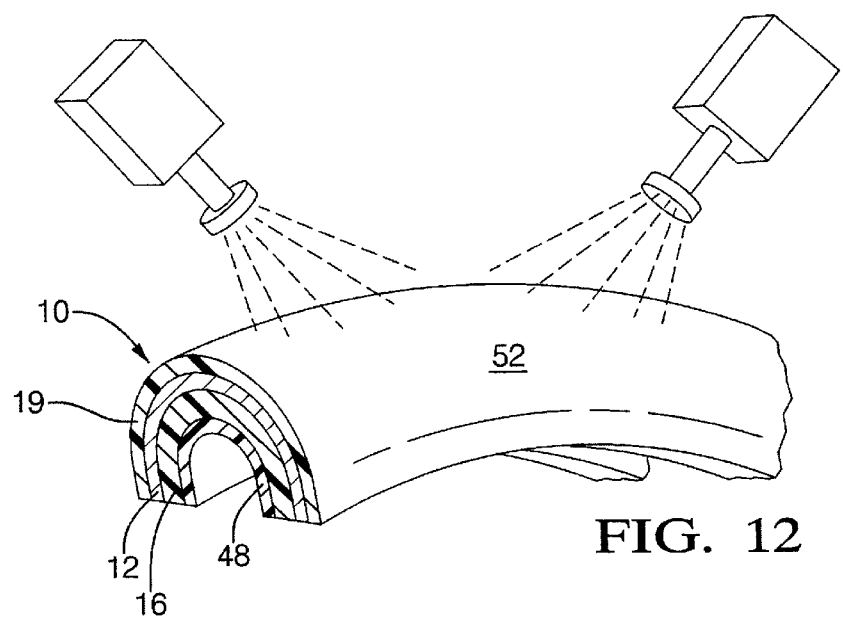
FIG. 12 is a perspective view of an alternative embodiment wherein an outer layer is applied to the preformed heating element.

In addition to the process described above, and in accordance with an alternative embodiment of the present disclosure and referring now to FIG. 12, a third layer 52 is applied on top of either second layer 48 or first layer 18 of the preformed heating element to add a decorative outside appearance to the rigid plastic part. This is particularly useful if the preformed heating element is exposed in a location where it is desirable to have an aesthetically pleasing outer layer. The part can also be clear coated with yet another layer to protect the film from abrasion. In yet another alternative, the method of applying third layer 52 may be used for applying the decorative layer to the conductive layer of the first layer 18.

Once formed by the processes or methods disclosed herein the preformed heating elements provide a hardened rigid shell which conforms to a particular area. The preformed shells can then be used as a replacements for real wood or provide any other decorative look as they will be ready for installation with the outer aesthetic appearances already applied. The shells can also be inserted into the backside of a real wood applique if required As yet another alternative the heating elements are insert molded directly onto the part requiring heating in order to eliminate further assembly steps.

Accordingly, the preformed heating element is capable of providing heat to a remote location or a second layer disposed over the preformed heating element. For example, an interior trim portion of a vehicle. It should be appreciated that the second layer may be made from a combination of materials to achieve the desired decorative appearance. For example, a portion of second layer covering the preformed heating element may be a material such as leather, while a portion of the second layer covering the inner rim may be a material such as plastic.

The third layer may be applied to the assembly through spraying and/or dipping in a manner similar to the application methods of the conductive layer. In yet another alternative the decorative coating is applied by bonding an additional decorative thin film over the heating element material, before, during or after the forming of the preformed heating element. In the case of leather or cloth, the second layer may be sewn and/or wrapped around the preformed heating element.

Advantageously, the preformed heating element provides for the elimination of irregularities and protrusions, collectively referred to as imperfections, associated with conventional heating elements. Such imperfections include pockmarks, bubbles, processing marks and artifacts. The presence of such imperfections provides a point source where excessive wearing of the heating element can occur during normal use. Also, imperfections can be seen through exterior (e.g., leather) coverings resulting in a non-aesthetically pleasing assembly. It should be appreciated that the preformed heating element may be applied in a variety of applications.

The preformed heating element provides for easy assembly of the element during the manufacturing process instead of applying a heating element directly on the desired location with adhesive or other means, the deposited heating element allows for a quick, accurate, and less damaging assembly, especially in areas where the location has irregular surfaces. Thus, the assembly of an item with the preformed heating element is less labor intensive. Also, the preformed heating element can be fully tested prior to assembly and production of the final heated item.

The preformed heating element of the present disclosure is molded to have an integral heating element disposed within preformed heating element. In an exemplary embodiment, the preformed heating element is formed by a manufacturing process wherein heating element (e.g., conductive layer) is sandwiched between two layers of material which when adhered to structural material provide a protective shell or covering to the heating element. The hardened preformed heating element is easily manipulated in prior manufacturing steps to the desired configuration prior to its application to the desired location. The preformed heating element is easily formed in a variety of configurations for numerous applications. For example, the preformed heating element, which contains the encapsulated conductive layer, may be easily secured to its desired location by any mechanical or chemical means as it is already preformed for use in that particular location (e.g., the tooling of the molds).

The manufacturing process of the present disclosure provides a preformed heating element that eliminates the undesirable effects of the irregularities and protrusions associated with heating elements that do not provide a uniform surface wherein a decorative covering is applied over the non-uniform surface of that element, and which can be seen through the decorative covering such as leather. In order to provide for a smooth surface, and an aesthetically pleasing and smooth outer appearance, the preformed heating element of the present disclosure is utilized.

The preformed heating element provides for easy assembly of the element during the manufacturing process of a heated item. Instead of applying a heating element directly on the desired location with adhesive or other means, the preformed heating element has the heating elements disposed therein and allows for a quick, accurate, and less damaging assembly onto the desired location.

Therefore, the present disclosure allows a preformed heating element to be formed wherein the preformed heating element has all of the advantages of in-mould decoration which applications thereof are described in the documents entitled:"In-Mould Decoration" and"New Application and practical examples involving in-mould decoration" and identified in the Information Disclosure Citation filed with the present application, the contents of which are incorporated herein by reference thereto.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A rigid preformed heating member, comprising:
a first non-rigid layer of vacuum formable items, comprising a formable film having a conductive layer deposited on one surface of the formable film, said conductive layer being configured for receiving an electrical current and providing a source of heat; and an outer layer disposed over said conductive layer; and
a second layer adhered to another surface of the formable film, wherein said second layer provides rigidity to the preformed heating member, said rigid preformed heating member being formed by the method comprising:
disposing said vacuum formable items in a mold;
vacuum forming said first layer into a configuration corresponding to said mold, said first layer remaining flexible after vacuum forming; and
applying said second layer to said first layer via an injection molding process, said second layer provides rigidity to said rigid preformed heating member, wherein said second layer is applied to said first layer after said first layer is formed by vacuum forming.

2. The rigid preformed heating member as in claim 1, wherein said conductive layer is applied to the formable film by inking.

3. The rigid preformed heating member as in claim 2, wherein the rigid preformed heating member is stamped or cut from said first and second layer after said second layer is applied.

4. The rigid preformed heating member as in claim 2, wherein the conductive layer comprises metal, carbon particles, graphite particles, carbon fibrils, graphite fibers, graphite micro-tubes, metal coated carbon, metal coated graphite, or a combination comprising at least one of the foregoing.

5. The rigid preformed heating member as in claim 4, wherein said metal is copper, silver, nickel, or a combination comprising at least one of the foregoing.

6. The rigid preformed heating member as in claim 2, wherein the conductive layer is formed from a curable electrically conductive ink comprising an electrically conductive material.

7. The rigid preformed heating member as in claim 1, wherein said second layer is a curable medium.

8. The rigid preformed heating member as in claim 7, wherein said curable medium comprises a polymeric resin selected from the group consisting of thermosetting resins, elastomeric resins, thermoplastic resins, and combinations comprising at least one of the foregoing.

9. The rigid preformed heating member as in claim 8, wherein said polymeric resin comprises an acrylic.

10. The rigid preformed heating member as in claim 8, wherein said formable film is a sheet of a formable film.

11. The rigid preformed heating member as in claim 10, wherein said sheet of formable film is a polycarbonate/polyester blended film.

12. A rigid preformed heating member, comprising:
   a first non-rigid layer of vacuum formable items comprising a sheet of formable film; a conductive layer for receiving an electrical current and providing a source of heat, said conductive layer being disposed on said sheet of formable film as an ink; and a decorative layer deposited on said conductive layer, wherein said first layer comprising said sheet of formable film, said conductive layer and said decorative layer are formed by a forming process wherein said first layer is non-rigid after said forming process; and
   a second layer disposed on said first layer after said forming process, said second layer providing a smooth surface and provides rigidity to the first layer, said rigid preformed heating member being formed by the method comprising:
   disposing said vacuum formable items in a mold;
   vacuum forming said first non-rigid layer into a configuration corresponding to said mold, said first non-rigid layer remaining flexible after vacuum forming; and
   applying said second layer to said first non-rigid layer, said second layer provides rigidity to said rigid preformed heating member, wherein said second layer is applied to said first non-rigid layer after said first non-rigid layer is formed by vacuum forming.

13. The rigid preformed heating member as in claim 12, wherein said second layer is a curable medium and said curable medium comprises a polymeric resin selected from the group consisting of thermosetting resins, elastomeric resins, thermoplastic resins, and combinations comprising at least one of the foregoing.

14. The rigid preformed heating member as in claim 13, wherein said sheet of formable film is a polycarbonate/polyester blended film.

15. The rigid preformed heating member as in claim 12, wherein said curable medium is applied by either resin impregnating or injection molding process.

16. The rigid preformed heating member as in claim 12, further comprising a thermistor, wherein said thermistor is disposed between said first layer and said second layer.

* * * * *